United States Patent [19]
Chikamatsu et al.

[11] Patent Number: 5,852,318
[45] Date of Patent: Dec. 22, 1998

[54] SEMICONDUCTOR DEVICE

[75] Inventors: Kiyoshi Chikamatsu; Toshiro Watanabe; Toshiaki Inoue; Yasushi Kose, all of Tokyo, Japan

[73] Assignee: NEC Corporation, Tokyo, Japan

[21] Appl. No.: 25,998

[22] Filed: Feb. 19, 1998

[30] Foreign Application Priority Data

Feb. 28, 1997 [JP] Japan .................................. 9-045525

[51] Int. Cl.$^6$ .............................. H01L 29/76; H01L 23/62
[52] U.S. Cl. ............................................. 257/390; 257/401
[58] Field of Search .................................. 257/390, 401, 257/341, 355, 360, 368, 393

[56] References Cited

U.S. PATENT DOCUMENTS

| | | | |
|---|---|---|---|
| 5,449,939 | 9/1995 | Horiguchi et al. | 257/360 |
| 5,652,452 | 7/1997 | Asano | 257/341 |
| 5,703,744 | 12/1997 | Jinda | 257/300 |
| 5,731,614 | 3/1998 | Ham | 257/355 |

FOREIGN PATENT DOCUMENTS

| | | | |
|---|---|---|---|
| 51-80063 | 12/1949 | Japan | 257/390 |
| 63-228667 | 9/1988 | Japan | 257/390 |
| 3-289143 | 12/1991 | Japan | 257/390 |

OTHER PUBLICATIONS

Alan Wood et al., "High Performance Silicon LDMOS Technology For 2GHzRF Power Amplifier Applications", IEEE 1996, pp 4.2.1–4.2.4.

Gordon MA et al., "High Efficiency Submicron Gate LDMOS Power FET For Low Voltage Wireless Communications", IEEE 1997, pp 1303–1306.

Osamu Ishikawa et al., "A High–Power High–Gain VD–MOSFET Operating at 900 MHz", IEEE Transactions on Electron Devices, vol. ED–34, No. 5, May 1987, pp 1157–1161.

*Primary Examiner*—Donald L. Monin, Jr.
*Attorney, Agent, or Firm*—Young & Thompson

[57] ABSTRACT

A semiconductor device includes: a plurality of first field effect transistors (FETs) having a gate formed on a main surface of a semiconductor substrate, and a drain and a source formed in regions on both sides of the gate; a plurality of second FETs having a gate formed on the main surface of the semiconductor substrate, and a drain and a source formed in regions on both sides of the gate; and an electrically conductive layer that penetrates the main surface and a back surface of the semiconductor substrate in a region between the pair of FETs; wherein the first and second FETs that form the pair of FETs are disposed close to each other so that their drains are opposite to each other; wherein region widths of the first and second FETs in a direction of shorter sides of sources thereof are substantially identical with region widths of the first and second FETs in a direction of shorter sides of drains thereof; wherein all the drains of the first and second FETs are electrically connected to each other; wherein all the gates of the first and second FETs are electrically connected to each other; and wherein all the sources of the first and second FETs are electrically connected to each other on the back surface of the semiconductor substrate through the conductive layer.

7 Claims, 7 Drawing Sheets

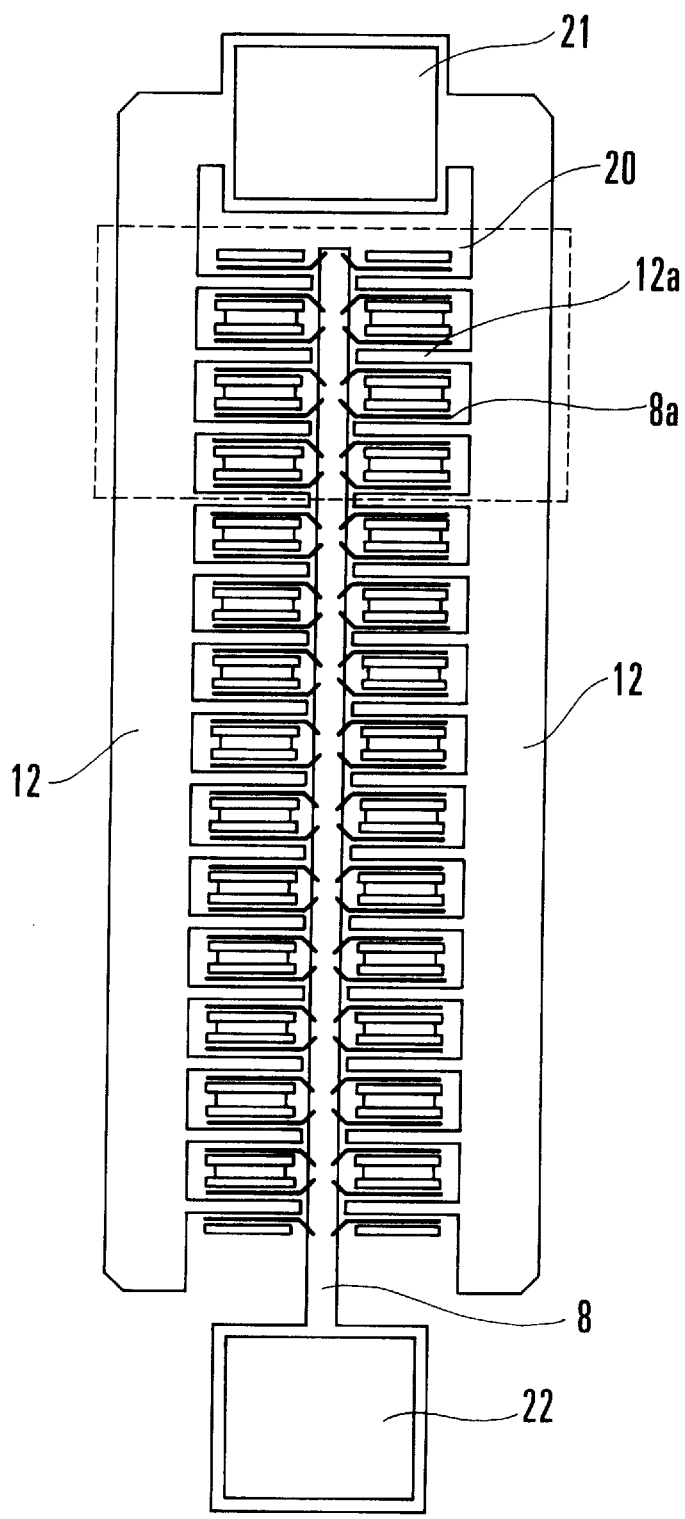
F I G. 1

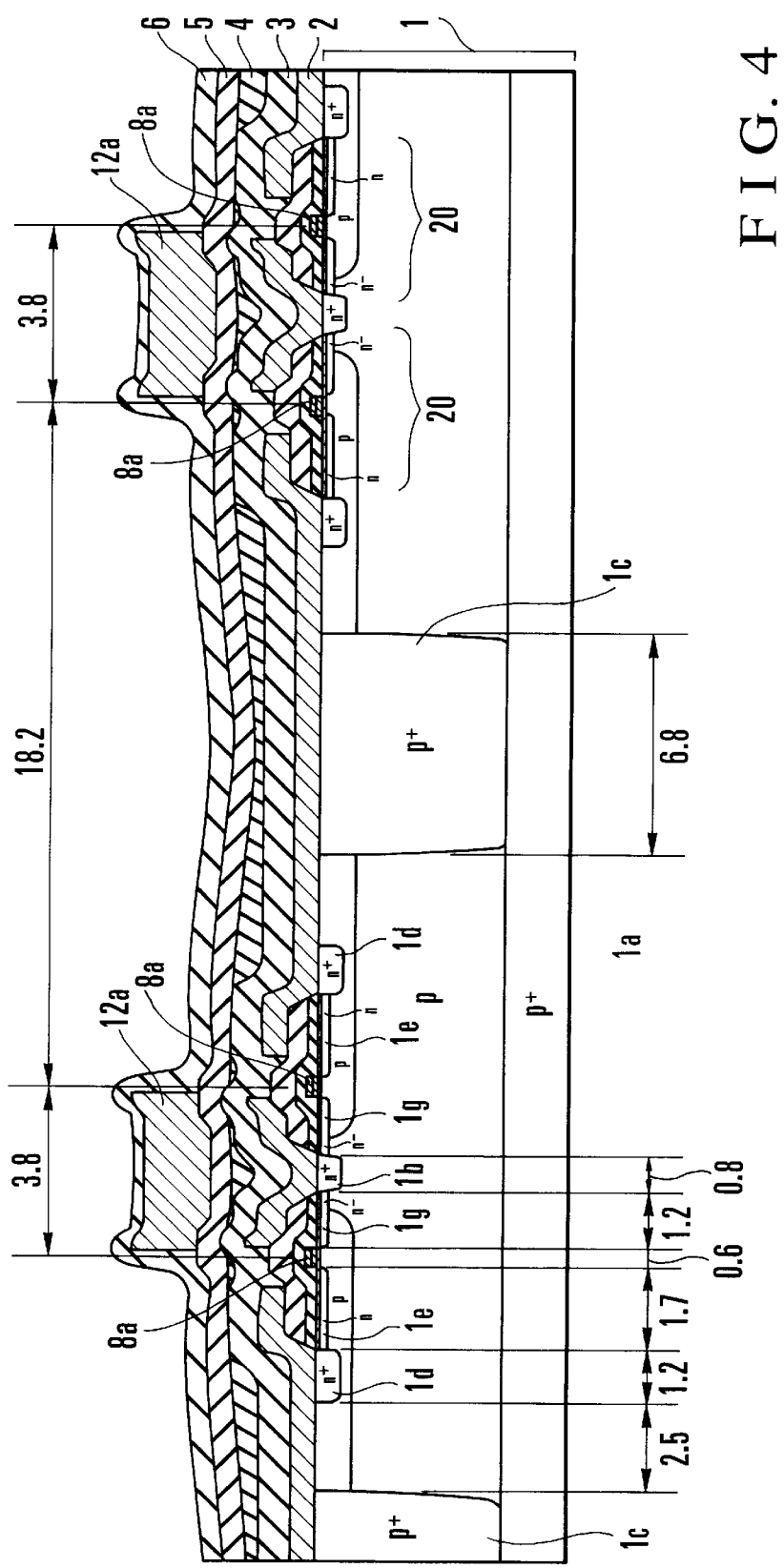
F I G. 4

SEMICONDUCTOR DEVICE

BACKGROUND OF THE INVENTION

The present invention relates to a power amplification semiconductor device used for amplifying a super high frequency signal, and more particularly to a semiconductor device having a structure in which a plurality of drains and gates are arranged in the form of comb blades, respectively (hereinafter, referred to as "multi-finger structure").

Up to now, a power transistor that amplifies a signal of several hundreds MHz (for example, 900 MHz) has been used in a transmission stage of a portable telephone. Since the portable telephone of this type is driven by a battery, it is desirable that the portable telephone can be used for a time as long as possible per charging. Also, in order to downsize an outline of the portable telephone and lighten the portable telephone in weight, it has been required to downsize the size of the battery per se. However, the reduction in the size of the battery makes it impossible to increase the battery capacity. Therefore, the power transistor for use in the portable telephone is required to reduce the circuit current for power amplification and to improve the amplification efficiency.

Under the above circumstances, in order to solve the above problems, for example, as disclosed in Japanese Utility Model Application Laid-Open No. 51-80063, there has been proposed a power transistor with a multi-finger structure which is made up of a plurality of field effect transistor cells each having a drain and a gate alternately disposed in the form of comb blades.

FIG. 7 shows a layout of the conventional power transistor with the multi-finger structure. As shown in FIG. 7, a plurality of sources 78, gate fingers 71 and drain fingers 73 are alternately disposed at given intervals to form a plurality of transistor cells (unit cell) 72. Hereinafter, a plurality of unit cells that are arrayed in a direction along which a drain lead electrode 74 and a gate lead electrode 76 extend is called "a transistor unit".

In each of the unit cells 72, the drain finger 73 is commonly connected to a drain pad 75 through the drain lead electrode 74. Likewise, in each of the unit cells 72 the gate finger 71 is commonly connected to a gate pad 77 through the gate lead electrode 76. In each of the unit cells 72, a source 78 is commonly connected to a semiconductor substrate through an electrically conductive layer 79.

Also, the drain pad 75 and the gate pad 77 are disposed in the vicinity of a center of the arrayed unit cell 72 to unify transmission times of a signal to the respective unit cells 72. The source 78 is connected to a lead frame (not shown) through the semiconductor substrate.

In the above manner, the respective gate fingers 71, that is, the respective gates are normally disposed at regular intervals. This is because a transistor having a large number of fingers can be efficiently designed with a structure in which the drains, the gates and the sources are repeatedly disposed. Also, with a structure in which a couple of gates commonly have one drain and source, an arrangement area can be reduced. Furthermore, the transmission rate of a signal can be unified so that signals amplified by the unit cell can be synthesized without any transmission loss.

As mentioned above, the conventional power transistor with the multi-finger structure is disposed in such a manner that a plurality of gate fingers are arranged at regular intervals. For that reason, distances between the respective adjacent gate fingers get very close to each other as integration is merely increased. As a result, a calorific power per unit area of the power transistor increases, resulting in a rise in the temperature of a chip surface.

Therefore, the drain finger electrode narrow in wiring width and high in current density leads to the occurrence of electro-migration. This results in a problem that the drain finger electrode is disconnected during a long-time use, whereby the lifetime of the transistor is lowered.

Also, an increase in the temperature makes the electron mobility just under the gate fingers, that is, within a channel deteriorate to increase a channel resistance. This leads to such a problem that an output of the power transistor reduces. This means that the output per unit current is reduced to increase the loss.

On the other hand, taking a thermal adverse influence in the conventional arrangement into consideration, in the case where a diffusion region in a direction of the shorter sides of the source or drain fingers is increased in width, there arises such a problem that a parasitic capacitance between the source and the drain is increased to degrade a high-frequency characteristic. In this way, the conventional arrangement makes it difficult to provide a design that satisfies both of the reduced thermal adverse influence and the improved electric characteristic.

SUMMARY OF THE INVENTION

The present invention has been made to solve the above problems in the conventional devices, and therefore one object of the present invention is to provide a semiconductor device with a multi-finger structure which is capable of suppressing an increase in calorific power per unit area during operation.

Another object of the present invention is to provide a semiconductor device with a multi-finger structure high in efficiency and excellent in high-frequency characteristic.

In order to achieve the above objects, according to the present invention, there is provided a semiconductor device, comprising: a plurality of first field effect transistors (FETs) having a gate formed on a main surface of a semiconductor substrate, and a drain and a source formed in regions on both sides of the gate, and disposed at a first predetermined interval; a plurality of second FETs having a gate formed on the main surface of the semiconductor substrate, and a drain and a source formed in regions on both sides of the gate, and disposed at the first predetermined interval, the first and second FETs being disposed at a second predetermined interval narrower than the first predetermined interval to form a pair of FETs; and an electrically conductive layer that penetrates the main surface and a back surface of the semiconductor substrate in a region between the pair of FETs; wherein the first and second FETs that form the pair of FETs are disposed close to each other so that their drains are opposite to each other; wherein region widths of the first and second FETs in a direction of shorter sides of sources thereof are substantially identical with region widths of the first and second FETs in a direction of shorter sides of drains thereof; wherein all the drains of the first and second FETs are electrically connected to each other; wherein all the gates of the first and second FETs are electrically connected to each other; and wherein all the sources of the first and second FETs are electrically connected to each other on the back surface of the semiconductor substrate through the conductive layer.

BRIEF DESCRIPTION OF THE DRAWINGS

In the accompanying drawings:

FIG. 1 is a diagram showing a layout of a power transistor according to an embodiment of the present invention;

FIG. 4 is a cross-sectional view showing a power transistor with an unequal gate pitch;

DESCRIPTION OF THE PREFERRED EMBODIMENTS

Figure 2:
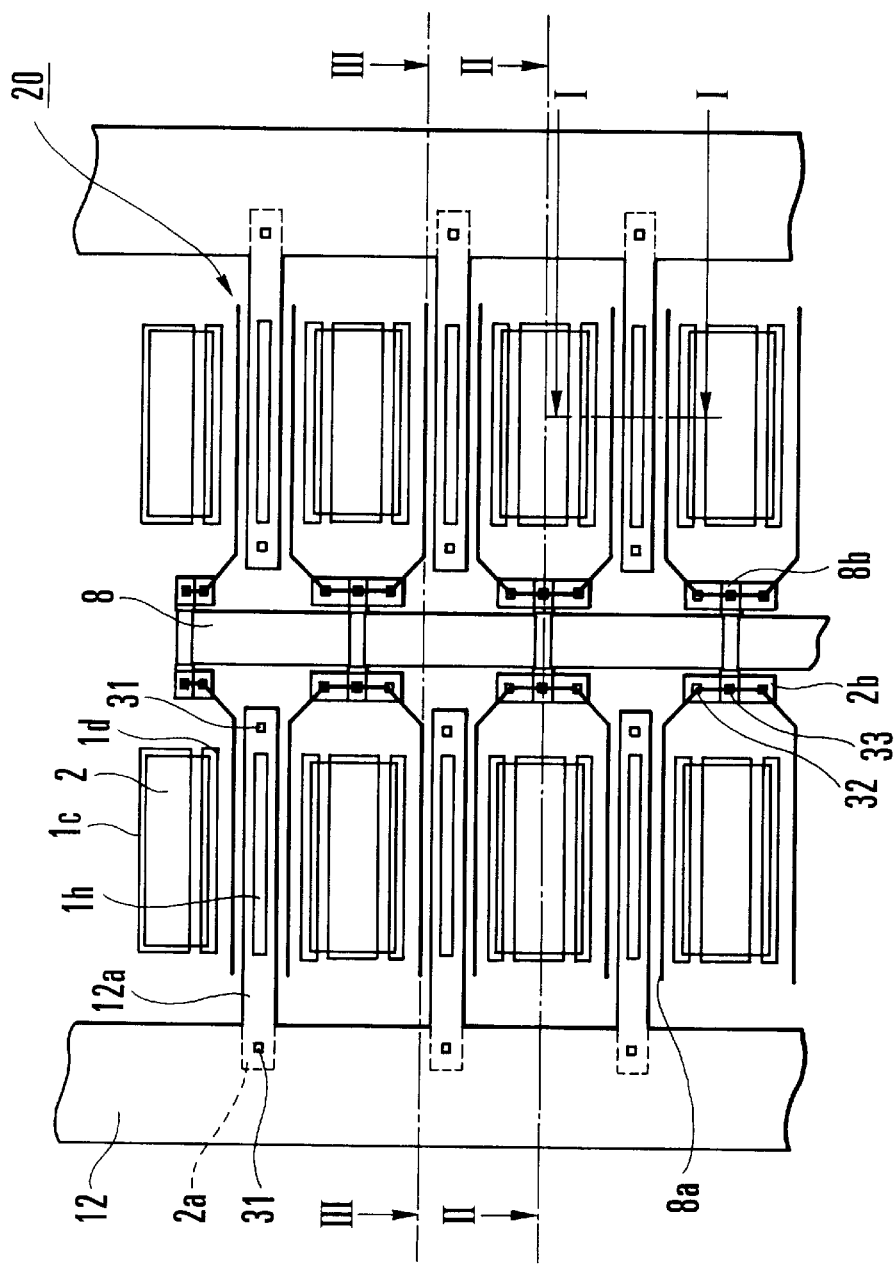
FIG. 2 is an enlarged diagram showing a portion indicated by a broken line in FIG. 1.

Now, a description will be given in more detail of a preferred embodiment of the present invention with reference to the accompanying drawings.

FIG. 1 is a diagram showing a layout of a power transistor according to an embodiment of the present invention. The power transistor shown in FIG. 1 includes, on a chip, a plurality of unit cells 20 that are disposed in two arrays and have gate finger electrodes 8a, drain finger electrodes 12a and sources. Each of the unit cells 20 has an FET (field effect transistor) structure.

The drain finger electrodes 12a are disposed at regular intervals in such a manner that one of the drain finger electrodes 12a is provided commonly for two unit cells 20. One end of each drain finger electrode 12a is commonly connected to two drain lead electrodes 12 formed in parallel outside of the unit cells 20 that are disposed in two arrays, whereas the other end of the drain finger electrode 12a faces a gate lead electrode 8, which will be described later, at a given interval. Respective one end sides of the drain lead electrodes 12 are connected to each other through connection portions so as to be U-shaped, and a drain pad 21 for connecting a bonding wire is formed at the connection portion.

One end of the gate finger electrode 8a of each unit cell 20 is commonly connected to one gate lead electrode 8 which is formed between those two drain lead electrodes 12. The gate lead electrode 8 is formed in parallel with two drain lead electrodes 12 in its center in such a manner that the respective unit cells 20 disposed in two arrays are separated one array by one array. The other end of the gate finger electrode 8a faces the drain lead electrode 12 at a given interval. One end of the gate lead electrode 8 at a side opposite to the drain pad 21 is formed with a gate pad 22 for connecting the bonding wire.

Then, the detailed layout of the unit cell 20 shown in FIG. 1 will be described with reference to FIG. 2. FIG. 2 is an enlarged diagram showing a portion surrounded by a broken line of FIG. 1.

In FIG. 2, a drain finger electrode (a second layer aluminum wiring) 12a is connected to a drain finger electrode (a first layer aluminum wiring) 2a formed in an overlapping manner below the drain finger electrode 12a through a through-hole 31. The drain finger electrode (first layer aluminum wiring) 2a is connected to a drain contact 1h commonly used for two unit cells which are close to each other in a semiconductor substrate as will be described later. The drain finger electrode 12a in each unit cell with the above-mentioned connection structure is commonly connected to the drain lead electrodes 12.

On the other hand, those two gate finger electrodes 8a formed on the semiconductor substrate are so disposed as to be close to each other on both sides of the drain finger electrode 12a in such a manner that two gate finger electrodes 8a at a wide interval between the drain finger electrodes 12a are connected to each other at one ends thereof. In other words, the gate finger electrodes 8a are formed at unequal intervals so as to provide a narrow interval where the drain finger electrode 12a is interposed and a wide interval between the drain finger electrodes 12a.

One ends of those two gate finger electrodes 8a having the wide interval are commonly connected to the gate wiring (first layer aluminum wiring) 2b through a through-hole 32, and the gate wiring (first layer aluminum wiring) 2b is connected to a gate lead electrode projection 8b through a through-hole 33. The respective gate lead electrode projections 8b are commonly connected to the gate lead electrode 8.

If the gate lead electrode 8 is formed of the first layer aluminum wiring which is the same layer as the gate wiring (first layer aluminum wiring) 2b, the thickness of an interlayer insulation film between the gate lead electrode 8 (first layer aluminum wiring) and the semiconductor substrate 1 becomes a sum of the respective thicknesses of a gate oxide film ($SiO_2$), an insulating layer ($SiO_2$) and a BPSG (boron phosphorus silicate glass) layer. Since this thickness is very thin, the parasitic capacitance of the gate lead electrode 8 becomes large, resulting in the deterioration of the high-frequency characteristic. Therefore, it is desirable that the gate lead electrode 8 is formed of the second layer aluminum wiring.

However, when the second layer aluminum wiring and the gate finger electrodes 8a are in direct contact with each other, the aspect ratio of the contact hole becomes large, thereby being liable to cause contact failure. In order to prevent this drawback, the gate finger electrode 8a is connected to the gate lead electrode projection 8b through the gate wiring (first layer aluminum wiring) 2b once, and the gate lead electrode projection 8b is connected to the gate lead electrode 8 which is the second layer aluminum wiring.

Also, the source contact id in the semiconductor substrate is connected with a just-above-source electrode (first layer aluminum wiring) 2, and the just-above-source electrode (first layer aluminum wiring) 2 is connected to the $p^+$ implanted layer 1c formed between the drain finger electrodes 12a in the semiconductor substrate.

In this embodiment, the drain lead electrode 12 is 25 $\mu$m in width and 500 $\mu$m in length, and the gate lead electrode 8 is 20 $\mu$m in width and 450 $\mu$m in length. The drain finger electrode (first layer aluminum wiring) 2a and the drain finger electrode (second layer aluminum wiring) 12a are 3.2 $\mu$m in width and 50 $\mu$m in length. The gate finger electrode 8a is 0.6 $\mu$m in width and 50 $\mu$m in length. The source contact 1d is formed by a region where phosphorus or arsenic is diffused in the semiconductor substrate with a concentration of 1E15 to 1E21 ($cm^{-3}$), and is 1.2 $\mu$m in width and 50 $\mu$m in length. The $p^+$ implanted layer 1c is formed by a region where boron is diffused in the semiconductor substrate with a concentration of 1E16 to 1E22 ($cm^{-3}$), and is 6.8 $\mu$m in width and 48 $\mu$m in length. Also, the drain pad 21 and the gate pad 22 are configured in square of 100 $\mu$m in each side.

Figure 3:
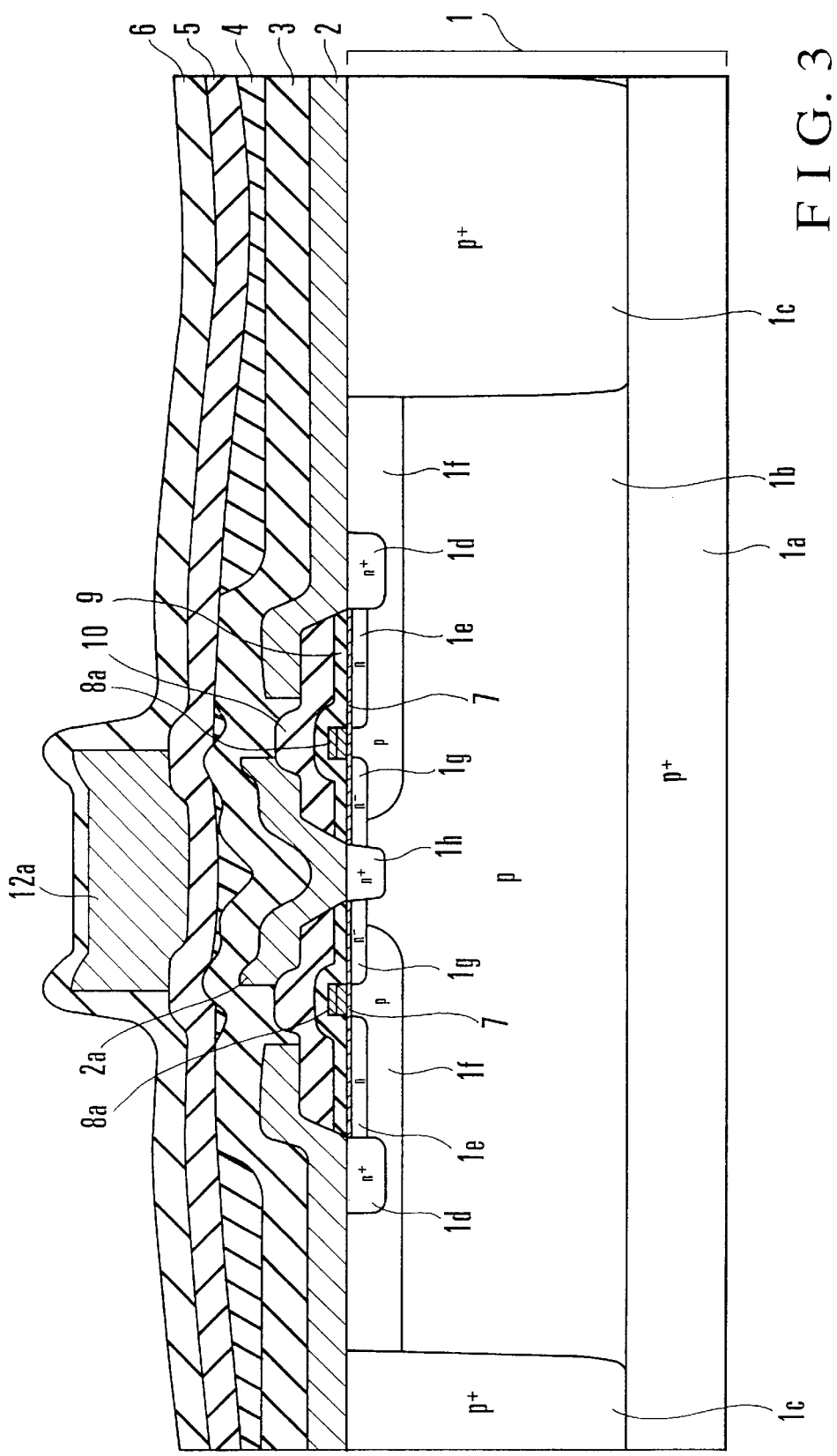
FIG. 3 is a cross-sectional view taken along a line I—I of FIG. 2.

FIG. 3 is a cross-sectional view taken along a line I—I of FIG. 2. In FIG. 3, there are formed, on a $p^+$ substrate 1a that forms an Si substrate 1 which is a semiconductor substrate, a p-epitaxial layer 1b in a region corresponding to each of the drain finger electrodes 12a and a $p^+$ implanted layer 1c in a region between the respective adjacent drain finger electrodes 12a. Two p-wells 1f are formed on a surface of the p-epitaxial layer 1b at a given interval, and the gate finger electrode 8a is formed on each of the p-wells 1f through a gate oxide film 7. A source diffusion layer (n) 1e and a drain diffusion layer ($n^-$) 1g are formed on the surface of each p-well 1f on both sides of the gate finger electrode 8a in such a manner that a drain contact ($n^+$) 1h which is in contact with the respective end portions of the two opposed drain diffusion layers ($n^-$) 1g is formed on the surface of the p-epitaxial layer 1b between the p-wells 1f. On the other hand, a source contact ($n^+$) 1d is formed on the surface of each p-well 1f so as to be in contact with an end portion of the source diffusion layer (n) 1e.

The gate finger electrode 8a is formed by sequentially laminating a polycrystal Si (150 nm in thickness) and a WSi (170 nm in thickness) from a main surface side of an Si substrate 1. The widthwise section of the gate finger electrode 8a is machined to provide a sectional dimension having an electrode width about 0.6 μm. The gate finger electrode 8a and the gate oxide film 9 are covered with an $SiO_2$ layer 9 on which a BPSG layer 10 is formed.

On the Si substrate 1 on which the BPSG layer 10 is formed is selectively formed the first layer aluminum wiring layer (just-above-source electrode 2, the drain finger electrode 2a, etc.). On the first aluminum wiring layer are sequentially formed a p-TEOS (plasma-tetraethylortho silicate) layer 3, an organic silica+inorganic silica layer 4, and a p-TEOS layer 5. The second layer aluminum wiring layer (drain finger electrode 12a, etc.) is formed on the p-TEOS layer 5 between the gate finger electrodes 8a, and a passivation nitride film (hereinafter referred to as "p nitride film") 6 is formed on the second layer aluminum wiring layer and the p-TEOS layer 5.

The first layer aluminum wiring layer is formed by sequentially laminating TiN (30 nm in thickness), Ti (50 nm in thickness), Al-Si-Cu (550 nm in thickness) and TiN (30 nm in thickness) from the Si substrate 1 side.

In the semiconductor device thus structured, upon application of a gate voltage, the gate finger electrode 8a forms an electric field in a channel formed in the p-well 1f within the Si substrate 1 through the gate oxide film 7. As a result, the conductivity of the channel between the source diffusion layer 1e and the drain diffusion layer 1g is controlled by the gate voltage.

The drain finger electrode (second layer aluminum wiring) 12a and the drain finger electrode (first layer aluminum wiring) 2a are formed in parallel with the gate finger electrode 8a as shown in FIG. 2. The drain finger electrode (first layer aluminum wiring) 2a is connected to a drain diffusion layer 1g in the Si substrate 1 through the drain contact 1h.

The source diffusion layer 1e extending from the gate finger electrode 8a to the source contact 1d in a longitudinal direction of the gate is connected to the just-above-source electrode (first layer aluminum wiring) 2 through the source contact 1d. The just-above-source electrode 2 is connected to the $p^+$ implanted layer 1c which is a high-concentration layer having a depth that reaches the $p^+$ substrate 1a.

Subsequently, the diffusion layer within the Si substrate 1 will be described. Table 1 represents diffusion species and impurity concentrations in the respective diffusion layers of FIG. 3. The respective layers are formed by ion-implanting the diffusion species listed in Table 1 with the impurity concentrations listed together.

TABLE 1

|  | Diffusion Species | Impurity Concentration ($cm^2$) |
| --- | --- | --- |
| Source contact 1d | Phosphorus or arsenic | 1E15 to 1E21 |
| Source diffusion layer 1e | Phosphorus or rsenic | 1E15 to 1E21 |
| p-well 1f | Boron | 1E14 to 1E19 |
| Drain diffusion layer 1g | Phosphorus or arsenic | 1E14 to 1E21 |
| Drain contact 1h | Phosphorus or arsenic | 1E15 to 1E21 |
| $p^+$ implanted layer 1c | Boron | 1E16 to 1E22 |
| p-epitaxial layer 1b | Boron | 1E12 to 1E17 |
| $p^+$ substrate 1a | Boron | 1E19 to 1E22 |

Table 2 represents the thicknesses of the respective layers in Si substrate.

TABLE 2

|  |  | Layer thickness |
| --- | --- | --- |
| p nitride film 6 |  | 500 nm |
| p-TEOS layer 5 |  | 600 nm |
| organic silica + inorganic silica layer 4 |  | coating the layer to the degree that flattens a step, etc. |
| p-TEOS layer 3 |  | 800 nm |
| just-above-source electrode 2 | TiN | 30 nm |
|  | Al—Si—Cu | 550 nm |
|  | Ti | 50 nm |
|  | TiN | 30 nm |
| drain finger electrode 12a (second layer aluminum wiring layer) |  | 1.6 μm |
| BPSG layer 10 |  | 650 nm |
| $SiO_2$ layer 9 |  | 180 nm |
| gate finger electrode 8a | WSi | 170 nm |
|  | polycrystal-Si | 150 nm |
| gate oxide film ($SiO_2$)7 |  | 35 nm |

Then, the intervals between the unit cells in the transistor unit will be described with reference to FIG. 4. FIG. 4 is a cross-sectional view showing a gate pitch in FIG. 3. As shown in FIG. 4, two unit cells 20 that interpose the drain finger electrode 12a therebetween and are close to each other in a direction of arraying the unit cells commonly use a drain contact 1h and a drain finger electrode 12a to shorten the gate pitch. In this structure, the gate pitch, that is, a pitch between the gate finger electrodes 8a narrow in interval is 3.8 μm.

On the other hand, a $p^+$ implanted layer 1c which is 6.8 μm in a width for electrically connecting the just-above-source electrode 2 and the $p^+$ substrate 1a is formed in the Si substrate 1 between the drain finger electrodes 12a wide in interval. Therefore, an interval between the drain finger electrodes 12a is 18.2 μm which is longer than the above-mentioned gate pitch.

In other words, in the present invention, because the gate pitches are unequal, that is, the gate pitches of the wide intervals and the gate pitches of the narrow intervals are alternately disposed, the $p^+$ implanted layers 1c can be formed between the respective gates wide in interval. With this structure, the source diffusion layer 1e can be connected to the p substrate 1a through the source contact 1d, the just-above-source wiring 2 and the p$^+$ implanted layer 1c. As a result, the wiring structure for the source is simplified, thereby being capable of manufacturing the semiconductor device with the multi-finger structure inexpensively.

The specific length of the respective diffusion layers is shown in FIG. 4. A distance between the p$^+$ implanted layer 1c and the source contact 1d is 2.5 μm. The length of the source contact 1d is 1.2 μm. The length of the source diffusion layer 1e is 1.7 μm. The length of the gate (the width of the gate finger electrode 8a) is 0.6 μm. The length of the drain diffusion layer 1g is 1.2 μm. The length of the drain contact 1h is 0.8 μm.

Figure 5:
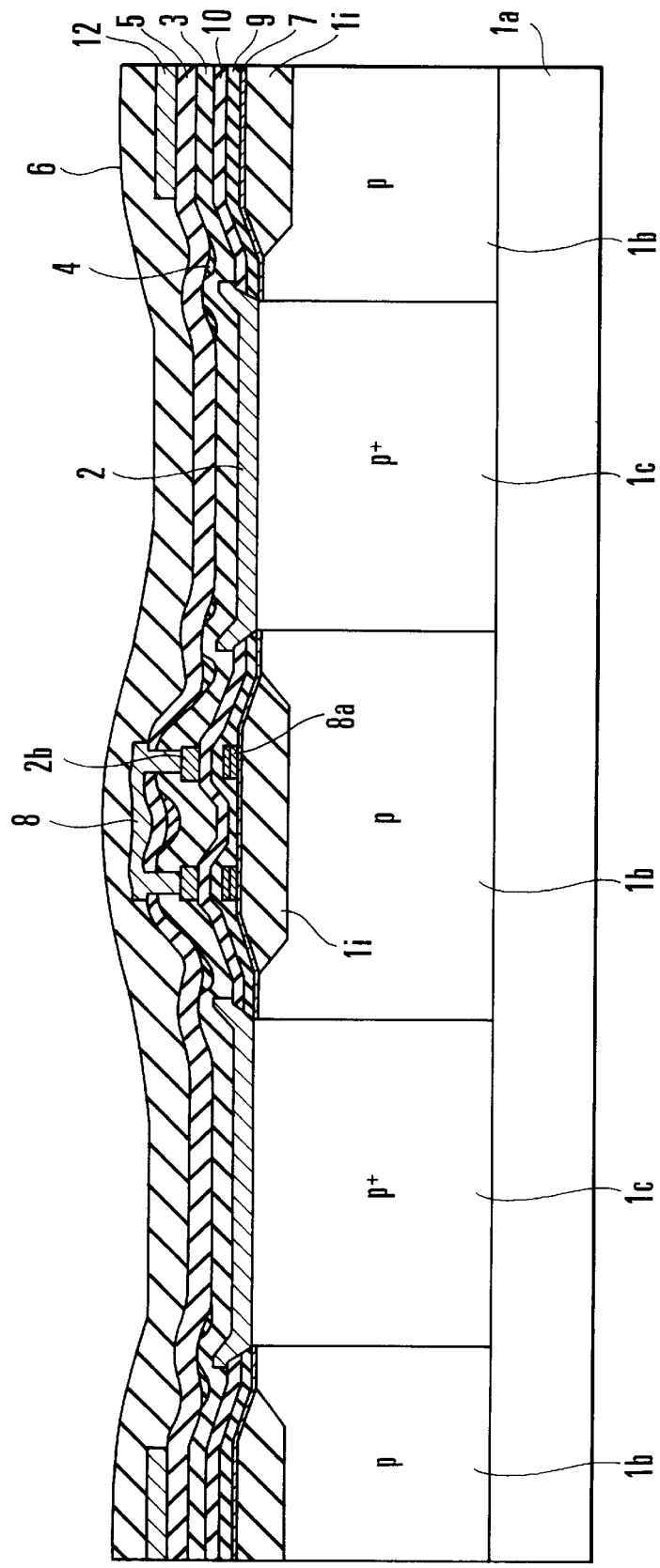
FIG. 5 is a cross-sectional view taken along a line II—II of FIG. 2.
Figure 6:
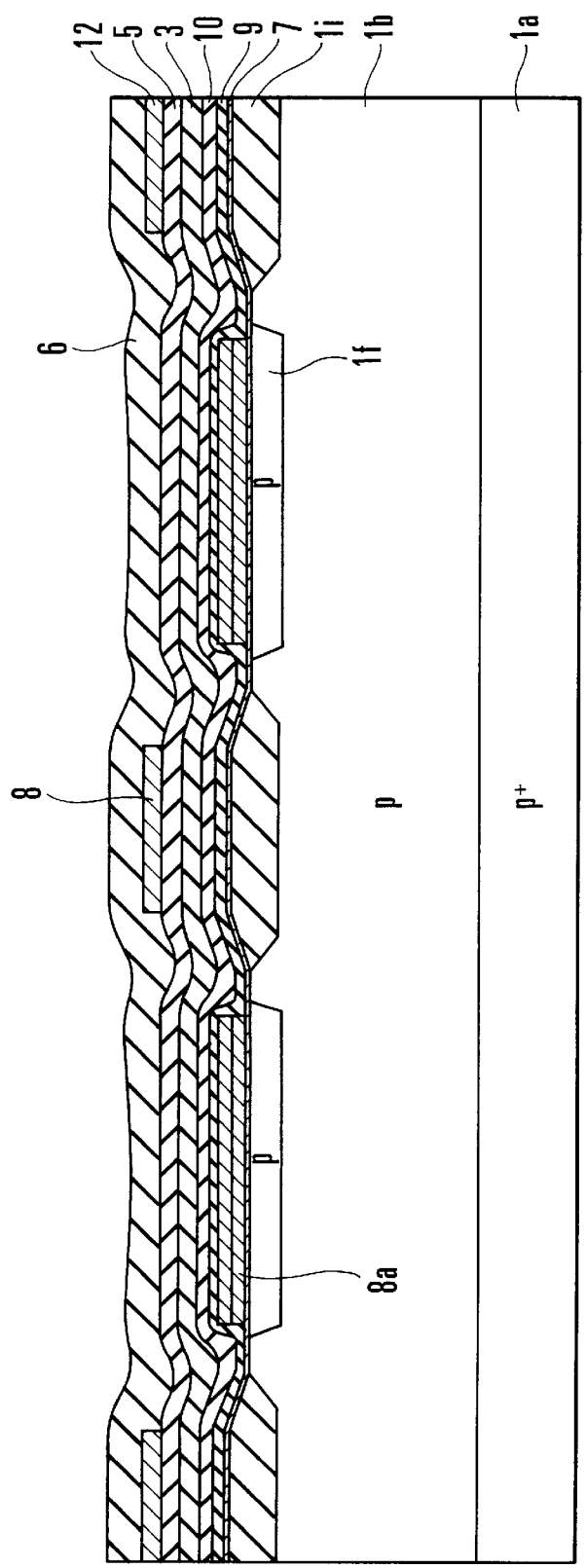
FIG. 6 is a cross-sectional view taken along a line III—III of FIG. 2.
Figure 7:
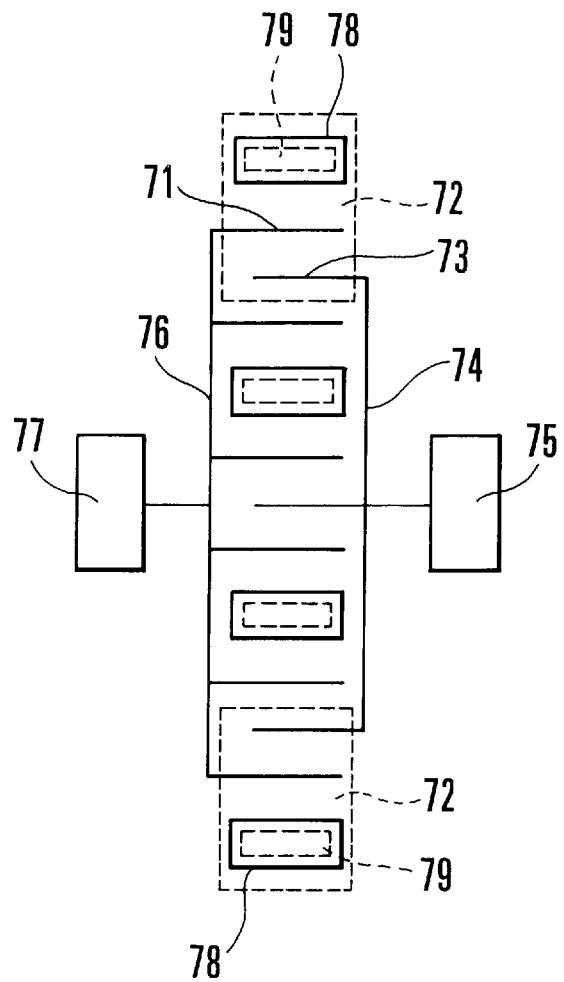
FIG. 7 is a diagram showing a layout of a conventional power transistor.

FIG. 5 is a cross-sectional view taken along a line II—II of FIG. 2, and FIG. 6 is a cross-sectional view taken along a line III—III of FIG. 2. In FIGS. 5 and 6, a field oxide film 1i for element separation is formed in the Si substrate 1 just below the gate lead electrode 8 and the drain lead electrode 12. The thickness of the field oxide film 1i is 400 nm.

According to the present embodiment, since two regions of the source diffusion layers (n) 1e are formed between the gate finger electrodes 8a wide in interval, and the width of the source diffusion layer (n) 1e in a direction of shorter sides thereof is made substantially identical with the width of the drain diffusion layer (n$^-$) 1g as in the prior art, there is no increase in parasitic capacitance between the source and the drain, to thereby obtain a high-frequency characteristic equal to the conventional one.

Also, the p$^+$ implanted layer 1c is provided between the unit cells 20 corresponding to the gate finger electrodes 8a wide in interval and connected to the source contacts 1d of the respective cells 20 through the just-above-source electrode 2 to widen the width of the p$^+$ implanted layer 1c per se, or the interval between the p$^+$ implanted layer 1c and the source contact 1d is widened, to thereby widen the gate pitch that interposes the source. As a result, while keeping the characteristic of the unit cell 20, the layout can be designed taking the thermal design into account. In other words, a heat concentratedly generated in a channel just below the gate finger electrode 8a is diffused by the source region 1e, thereby being capable of suppressing the temperature to a desired value. Therefore, even in the drain finger electrode 12a narrow in wiring width and high in current density, it becomes hard to generate electro-migration with the result that the lifetime of the transistor can be elongated.

If the width of the source diffusion layer (n) 1e in a direction of shorter sides thereof is increased, the layout can be designed taking the thermal influence into account, but the parasitic capacitance between the source and the drain is increased, resulting in the deterioration of the high-frequency characteristic. Japanese Utility Model Application Laid-Open No. 51-80063 has no disclosure about the gate pitch that interposes the source, in which one source diffusion region is formed between two gate finger electrodes.

In the present invention, an increase in the gate pitch that interposes the source can be realized without any adverse influence on the high-frequency characteristic by changing the width of the p$^+$ implanted layer 1c, or changing an interval between the source contact (n$^+$) 1d and the p$^+$ implanted layer 1c.

Furthermore, the advantage obtained by using the source as a substrate is also provided, that is, the source can be mounted directly on the lead frame, thereby being capable of reducing the source inductance and improving the calorific value. Still further, since a cross-over wiring between the source wiring and the drain or gate wiring can be eliminated, the parasitic capacitance between the respective wirings can be reduced.

As is described above, since the gate pitches are arranged to be unequal to each other, the calorific value per unit area can be reduced more than the conventional one in increasing the integration, thereby suppressing an arise in temperature. As a result, the occurrence of electro-migration in wiring can be suppressed. Also, since a temperature of the channel portion is suppressed to a lower value, the deterioration of the electron mobility can be suppressed to restrain an increase in channel resistance. Therefore, an efficiency-excellent power transistor can be realized without any deterioration of the output.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device, comprising:

a plurality of first field effect transistors (FETs) having a gate formed on a main surface of a semiconductor substrate, and a drain and a source formed in regions on both sides of the gate, and disposed at a first predetermined interval;

a plurality of second FETs having a gate formed on the main surface of said semiconductor substrate, and a drain and a source formed in regions on both sides of the gate, and disposed at the first predetermined interval, said first and second FETs being disposed at a second predetermined interval narrower than the first predetermined interval to form a pair of FETs; and an electrically conductive layer that penetrates the main surface and a back surface of said semiconductor substrate in a region between said pair of FETs, wherein said first and second FETs that form said pair of FETs are disposed close to each other so that their drains are opposite to each other, region widths of said first and second FETs in a direction of shorter sides of sources thereof are substantially identical with region widths of said first and second FETs in a direction of shorter sides of drains thereof, all the drains of said first and second FETs are electrically connected to each other, all the gates of said first and second FETs are electrically connected to each other, and all the sources of said first and second FETs are electrically connected to each other on the back surface of said semiconductor substrate through said conductive layer.

2. A semiconductor device as claimed in claim 1, wherein said pair of FETs are disposed at a predetermined interval larger than the second predetermined interval.

3. A semiconductor device as claimed in claim 2, wherein each of said pair of FETs includes one drain contact formed on the main surface of said semiconductor substrate and commonly connected with end portions of the respective drains of said first and second FETs, and two source contacts connected on the main surface of said semiconductor device and individually connected with end portions of the respective sources of said first and second FETs.

4. A semiconductor device as claimed in claim 3, further comprising:
- a plurality of drain finger electrodes electrically connected to said drain contact and formed on said semiconductor substrate;
- a drain lead electrode commonly connected with said drain finger electrodes in the form of comb blades;
- a plurality of gate finger electrodes which form the gates of said first and second FETs; and
- a gate lead electrode commonly connected with said gate finger electrodes in the form of comb blades.

5. A semiconductor device as claimed in claim 4, further comprising a gate wiring formed on said semiconductor substrate and commonly connected with the gate finger electrodes of said first FET and the gate finger electrodes of said second FET of said pair of FETs adjacent to each other,
   wherein said gate wiring is commonly connected to said gate lead electrode through an electrode projection.

6. A semiconductor device as claimed in claim 4, wherein a first unit is formed by said pair of FETs arranged in an array,
- a second unit is disposed linearly symmetrically with said first unit and formed by said pair of FETs arranged in an array,
- said drain lead electrodes of said first and second units are individually formed in a direction of arranging the units along outside of said pair of FETs disposed in two arrays,
- said drain lead electrodes of said first and second units are connected to each other at one ends thereof, and
- the gate lead electrodes of said first and second units are commonly used and formed in a direction of arranging the units in the center of said pair of FETs disposed in two arrays.

7. A semiconductor device as claimed in claim 5, further comprising:
- one drain pad formed on a connection portion of said first and second drain lead electrodes; and
- one gate pad formed on one end of said gate lead electrode at a side opposite to said drain pad.

* * * * *